United States Patent
Kwok et al.

(10) Patent No.: US 10,061,542 B2
(45) Date of Patent: Aug. 28, 2018

(54) PSEUDO DUAL PORT MEMORY

(71) Applicant: QUALCOMM Incorporated, San Diego, CA (US)

(72) Inventors: Tony Chung Yiu Kwok, Irvine, CA (US); Nishith Nitin Desai, San Diego, CA (US); Changho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/855,319

(22) Filed: Sep. 15, 2015

(65) Prior Publication Data
US 2017/0075379 A1 Mar. 16, 2017

(51) Int. Cl.
| G06F 3/06 | (2006.01) |
| G11C 11/419 | (2006.01) |
| G11C 7/10 | (2006.01) |
| G11C 7/22 | (2006.01) |
| G06F 13/16 | (2006.01) |

(52) U.S. Cl.
CPC .......... *G06F 3/0683* (2013.01); *G06F 3/0611* (2013.01); *G06F 3/0659* (2013.01); *G06F 13/1689* (2013.01); *G11C 7/1075* (2013.01); *G11C 7/22* (2013.01); *G11C 11/419* (2013.01)

(58) Field of Classification Search
CPC .... G06F 3/0683; G06F 3/0659; G06F 3/0611; G06F 1/12; G06F 1/06; G11C 7/1072; G11C 7/22; G11C 7/222; G11C 8/18; G11C 29/023; G11C 29/56012
See application file for complete search history.

(56) References Cited

U.S. PATENT DOCUMENTS

| 8,370,557 | B2 | 2/2013 | Dama et al. | |
| 8,902,672 | B2 | 12/2014 | Iyer et al. | |
| 2004/0190364 | A1* | 9/2004 | Jung | G11C 7/222 365/230.05 |
| 2007/0109909 | A1* | 5/2007 | Jung | G11C 7/1012 365/233.5 |
| 2009/0003119 | A1* | 1/2009 | Guo | G06F 13/4239 365/230.05 |
| 2009/0231937 | A1* | 9/2009 | Jung | G11C 7/1075 365/194 |
| 2012/0265951 | A1 | 10/2012 | Lin et al. | |
| 2013/0215689 | A1 | 8/2013 | Joshi et al. | |

(Continued)

OTHER PUBLICATIONS

International Search Report and Written Opinion—PCT/US2016/047219—ISA/EPO—dated Dec. 5, 2016.

*Primary Examiner* — Tuan Thai
*Assistant Examiner* — Alexander Yoon
(74) *Attorney, Agent, or Firm* — Arent Fox, LLP and Qualcomm Incorporated

(57) ABSTRACT

Aspects of a memory and method for accessing the memory are disclosed. The memory includes a plurality of memory cells configured to support a read and write operation in a memory cycle in a first mode and a write only operation in the memory cycle in a second mode. The memory further includes a control circuit configured to generate a read clock for the read operation and a write clock for the write operation. The timing of the write clock is a function of the timing of the read clock in the first mode, and the timing of the memory cycle in the second mode.

14 Claims, 12 Drawing Sheets

(56) References Cited

U.S. PATENT DOCUMENTS

2013/0227223 A1* 8/2013 Taylor .................. G11C 7/1075
  711/149
2014/0153349 A1   6/2014 Wu et al.

* cited by examiner

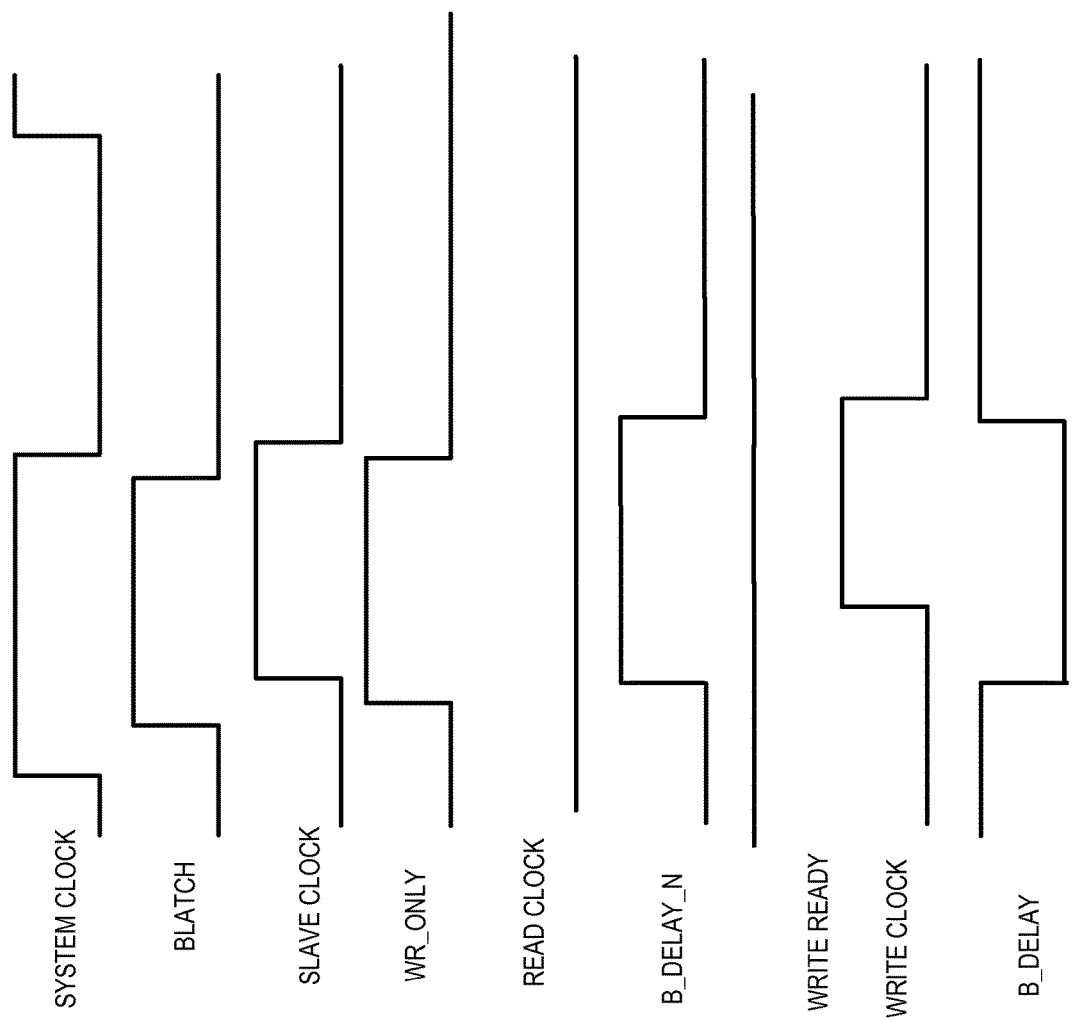

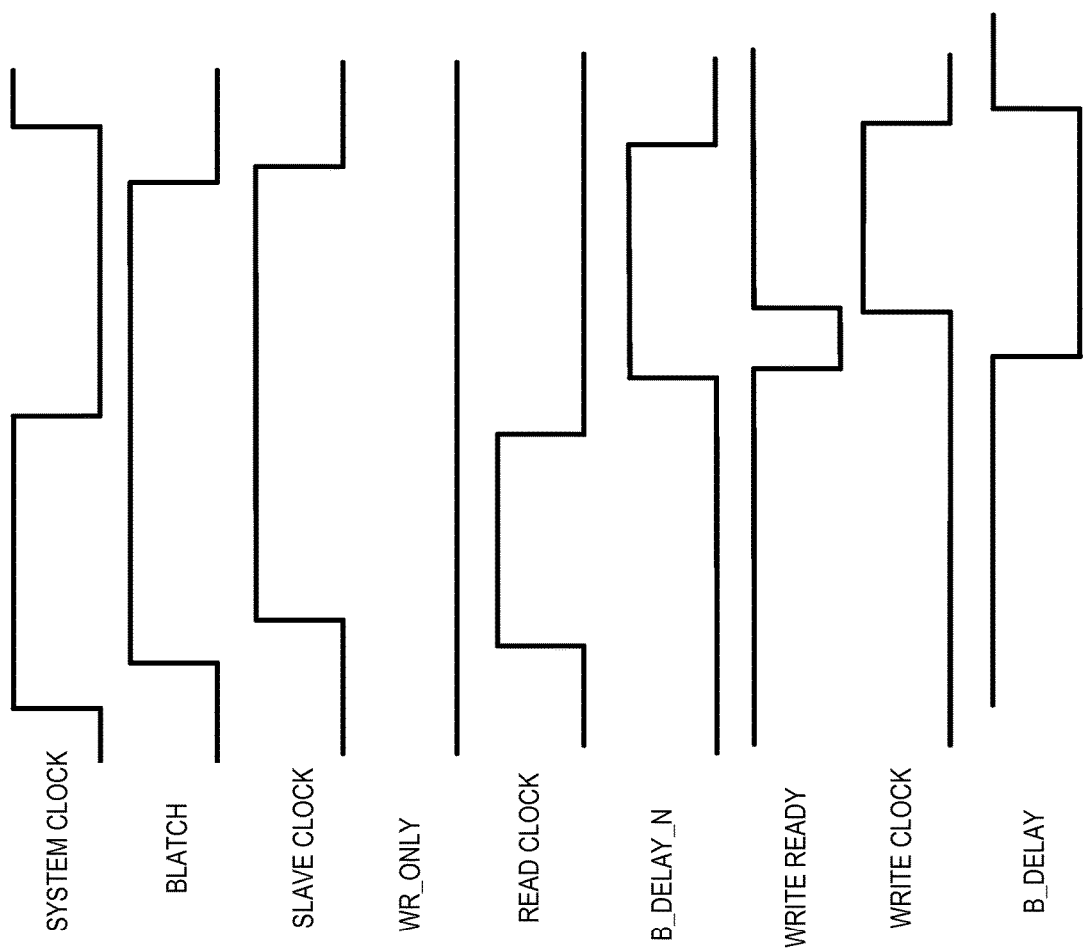

PSEUDO DUAL PORT MEMORY

BACKGROUND

Field

The present disclosure relates generally to integrated circuits, and more particularly, to pseudo dual port (PDP) memories.

Background

A dual port memory handles both a read and a write operation within a single clock cycle. A dual port memory typically includes two ports operating with an array of memory cells, which may be simultaneously accessed from both ports.

In order to reduce the area occupied by memory, a pseudo dual port (PDP) memory may be used to replace a dual port memory. The core of the PDP memory is a single-core memory which provides a single memory access, and not two simultaneous memory accesses as with the dual port memory. The PDP memory is, however, configured to emulate the dual port memory by sequentially performing two memory accesses in a memory cycle. For example, in a particular memory cycle, the PDP memory may perform a read operation and, then, perform a write operation.

SUMMARY

Aspects of a memory are disclosed. The memory includes a plurality of memory cells configured to support a read and write operation in a memory cycle in a first mode and a write only operation in the memory cycle in a second mode. The memory further includes a control circuit configured to generate a read clock for the read operation and a write clock for the write operation. The write clock is generated in response to the resetting of the read clock in the first mode, and the beginning of the memory cycle in the second mode.

Aspects of a method of accessing memory are disclosed. The memory includes a plurality of memory cells configured to support a read and write operation in a memory cycle in a first mode and a write only operation in the memory cycle in a second mode. The method includes generating, in the first mode, a read clock for the read operation and a write clock for the write operation, wherein the write clock is generated in response to the resetting of the read clock in the first mode, and generating, in the second mode, a write clock for the write operation in response to the beginning of the memory cycle.

Further aspects of a memory are disclosed. The memory includes a plurality of memory cells configured to support a read and write operation in a memory cycle in a first mode and a write only operation in the memory cycle in a second mode. The memory further includes a control circuit configured to generate a read clock for the read operation and a write clock for the write operation. The timing of the write clock is a function of the timing of the read clock in the first mode. The write clock occurs earlier in the memory cycle in the second mode than in the first mode.

Further aspects of a memory are disclosed. The memory includes a plurality of memory cells configured to support a read and write operation in a memory cycle in a first mode and a write only operation in the memory cycle in a second mode. The memory further includes a control circuit configured to generate a read clock for the read operation and a write clock for the write operation. The write clock is generated in response to the resetting of the read clock in the first mode. The write clock occurs earlier in the memory cycle in the second mode than in the first mode.

Other aspects of apparatuses described herein will become readily apparent to those skilled in the art based on the following detailed description, wherein various aspects of memory are shown and described by way of illustration. These aspects may be implemented in many different forms and its details may be modified in various ways without deviating from the scope of the present invention. Accordingly, the drawings and detailed description provided herein are to be regarded as illustrative in nature and not as restricting the scope of the claims.

BRIEF DESCRIPTION OF THE DRAWINGS

Various aspects of memory will now be presented in the detailed description by way of example, and not by way of limitation, with reference to the accompanying drawings, wherein:

FIG. 7A illustrates exemplary timing when a write only operation occurs during a memory cycle.

FIG. 7B illustrates exemplary timing when read and write operations occur during a memory cycle.

DETAILED DESCRIPTION

Figure 1:
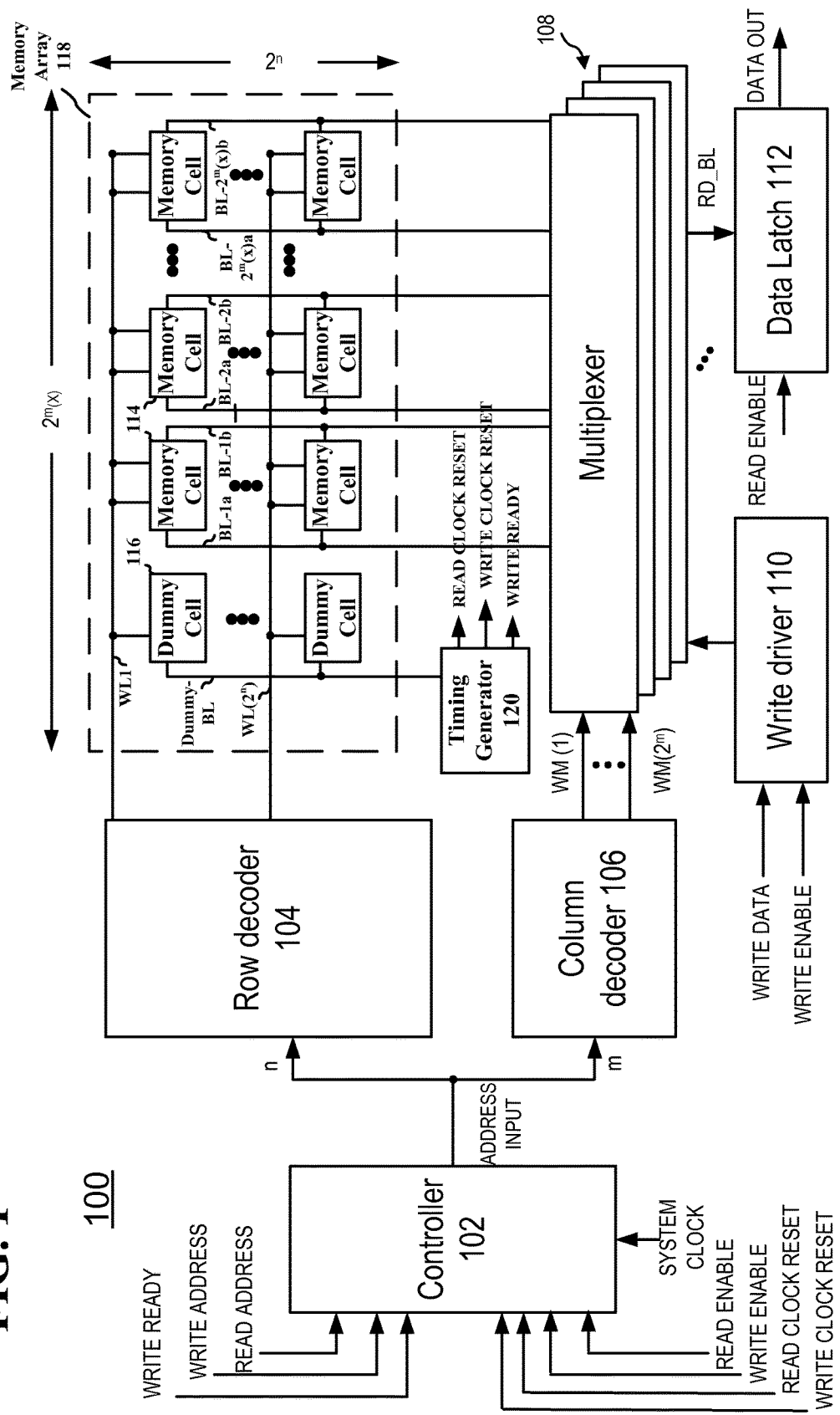
FIG. 1 is a functional block diagram of an exemplary embodiment of a static random access memory (SRAM).

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

Various memories presented throughout this disclosure may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, wireless communication attachments for laptops, or the like).

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, references to the plural include the singular, and references to the singular include the plural.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. Examples of other memories include random access memory (RAM), dynamic RAM (DRAM), synchronous dynamic RAM (SDRAM), double data rate RAM (DDRAM), read only memory (ROM), programmable ROM (PROM), erasable PROM (EPROM), electrically erasable PROM (EEPROM), a general register on a processor, flash memory, or any other suitable memory. Accordingly, all references to an SRAM are intended only to illustrate exemplary aspects of memory with the understanding that such aspects may be extended to a wide range of applications.

FIG. 1 is a functional block diagram of an exemplary embodiment of an SRAM.

The SRAM 100 includes a memory array 118 with supporting circuitry to decode addresses and perform read and write operations. The memory array 118 is comprised of memory cells 114 arranged to share connections in horizontal rows and vertical columns. Specifically, each horizontal row of memory cells 114 shares a wordline WL, and each vertical column of memory cells 114 shares a pair of bitlines (e.g., BL-1$a$ and BL-1$b$). The size of the memory array 118 (i.e., the number of cells) may vary depending on a variety of factors including the specific application, the speed requirements, the layout and testing requirements, and the overall design constraints imposed on the system. Typically, the memory array 118 may contain thousands or millions of memory cells.

In the exemplary embodiment of the SRAM shown in FIG. 1, the memory array 118 includes ($2^n \times 2^m$(x)) memory cells 114 arranged in $2^n$ horizontal rows and $2^m$(x) vertical columns, where $2^m$ is the number of words per row and x is the number of bits per word. A peripheral device (not shown) may randomly access any word (i.e., x cells) in the memory array 118 using an (n+m) bit wide address that is provided through a controller 102 to a row and column decoder 104 and 106, respectively. As will be described in greater detail later, the controller 102 is responsible for PDP memory operation by providing the timing for the read and write operation in a memory a cycle. The output from the controller 102 comprises an n-bit address provided to the input of a row decoder 104, and an m-bit address provided to the input of a column decoder 106. The column decoder 106 provides $2^m$ outputs (WM(1)-WM($2^m$)) with a different one of the outputs asserted for each different combination of address inputs.

The outputs are provided to x multiplexers 108. For a write memory access, each multiplexer is a $2^m$ multiplexer which switches one of x inputs from a write driver 110 between $2^m$ bitline pairs based on the outputs from the column decoder 106. By way of example, a memory array that stores four (4) 128-bit words per row requires 128 4:1 multiplexers. Each multiplexer input is coupled to one of 128 outputs from the write driver 110. Based on the decoded m-bit address, each multiplexer couples its input from the write driver 110 to one of 4 bitline pairs. The 4 bitline pairs are coupled to four memory cells, each storing a corresponding bit for a different word in a row. For example, the first of the 4 memory cells may store the least significant bit (LSB) of the first word, the second of the 4 memory cells may store the LSB of the second word, the third of the 4 memory cells may store the LSB of the third word, and the fourth of the 4 memory cells may store the LSB of the fourth word.

Thus, when the WRITE ENABLE signal is asserted, the write driver 110 drives the Write Data received from the peripheral device (not shown) onto x pairs of bitlines BL-a and BL-b with each of the x multiplexers driving one pair of bitlines (e.g., BL-1$a$ and BL-1$b$). The row decoder 104 converts the n-bit address into $2^n$ wordline outputs. A different wordline WL is asserted by the row decoder 104 for each different n-bit row address. As a result, each of the $2^m$(x) memory cells 114 in the horizontal row with the asserted wordline WL is connected to one pair of the $2^m$(x) bitlines (e.g., BL-1$a$ and BL-1$b$) through its access transistors, as will be described in more detail below with reference to FIG. 2. The write data is driven, through the x multiplexers 108, onto the selected pairs of bitlines (e.g., BL-1$a$ and BL-1$b$) and written to the memory cells with the asserted wordline WL.

For a read memory access, the row decoder 104 converts the n-bit address into one of the $2^n$ read wordlines. A different read wordline WL is asserted by the row decoder 104 for each different n-bit row address. As a result, each of the $2^m$(x) memory cells in the horizontal row with the asserted read wordline WL is connected to one of the $2^m$(x) read bitlines BL through its access transistor, as will be described in more detail below with reference to FIG. 2. The $2^m$(x) read bitlines BL are used to transmit the bits stored by the $2^m$(x) memory cells to the x multiplexers 108, with each multiplexer 108 selecting one bit from the $2^m$ bits transmitted on the read bitlines BL to the input of that multiplexer 108. The selected bits from the x multiplexers 108 are provided to the data latch 112 for outputting the data out. When the READ ENABLE signal is asserted, the selected bits are ready for the data latch 112.

As mentioned earlier, the controller 102 is responsible for PDP memory operation by providing the timing for the read and write operation in a memory cycle. The memory cycle is defined by the SYSTEM CLOCK input to the controller 102. The timing of the read and write operation is derived from internal READ and WRITE CLOCKS that are used to respectively multiplex READ and WRITE ADDRESS inputs from a peripheral device to the address decoder (i.e., row and column decoders 104 and 106). The READ clock is set by the READ ENABLE and reset by the READ CLOCK RESET. Similarly, the WRITE CLOCK is set by the WRITE ENABLE once the read operation is complete and reset by the WRITE CLOCK RESET. The READ and WRITE ENABLES are input to the controller 102 controlled from a peripheral device. The READ CLOCK and WRITE CLOCK RESETS are input to the controller 102 from a tracking circuit in the memory array 118.

As used herein, the terms "set" and "reset" with respect to a clock or other signal is intended to describe two different logic states of such clock or other signal regardless of polarity. By way of example, a clock or other signal may be described as having a high logic state (i.e., logic "1" state) when set and a low logic state (i.e., logic state "0") when reset. Alternatively, the clock or other signal may be described as being set to a low logic state and reset to a high logic state, as might be the case with an inverted clock or signal. Accordingly, the terms "set" and "reset" as used herein shall have no defined polarity, but rather shall be construed broadly to mean different logic states with reference to one another.

In the described exemplary embodiment, the tracking circuit includes a column of dummy cells 116 in the memory array. Each dummy cell 116 is configured to emulate the operation of a row of memory cells 114. Each dummy cell 116 is connected to the same WL for its row of memory cells 114. A timing generator 120 is used to monitor the Dummy BL from the dummy cell 116 connected to asserted WL. Specifically, the timing generator threshold detects the Dummy BL to track the access time of the selected memory cell 114 during read and/or write operations. By way of example, during a read operation, the timing generator 120 monitors the Dummy BL and outputs the READ CLOCK RESET when a known bit stored in the dummy cell 116 appears on the Dummy BL. Similarly, during a write operation, the timing generator 120 monitors the Dummy BL and outputs the WRITE CLOCK RESET when a known bit written to the dummy cell by the write driver 110 appears on the Dummy BL. In at least one exemplary embodiment, the timing generator 120 may also be used to generate a WRITE READY signal. The WRITE READY signal may be used by the controller to satisfy certain internal timing constraints of the write operation following the read operation.

Figure 2:
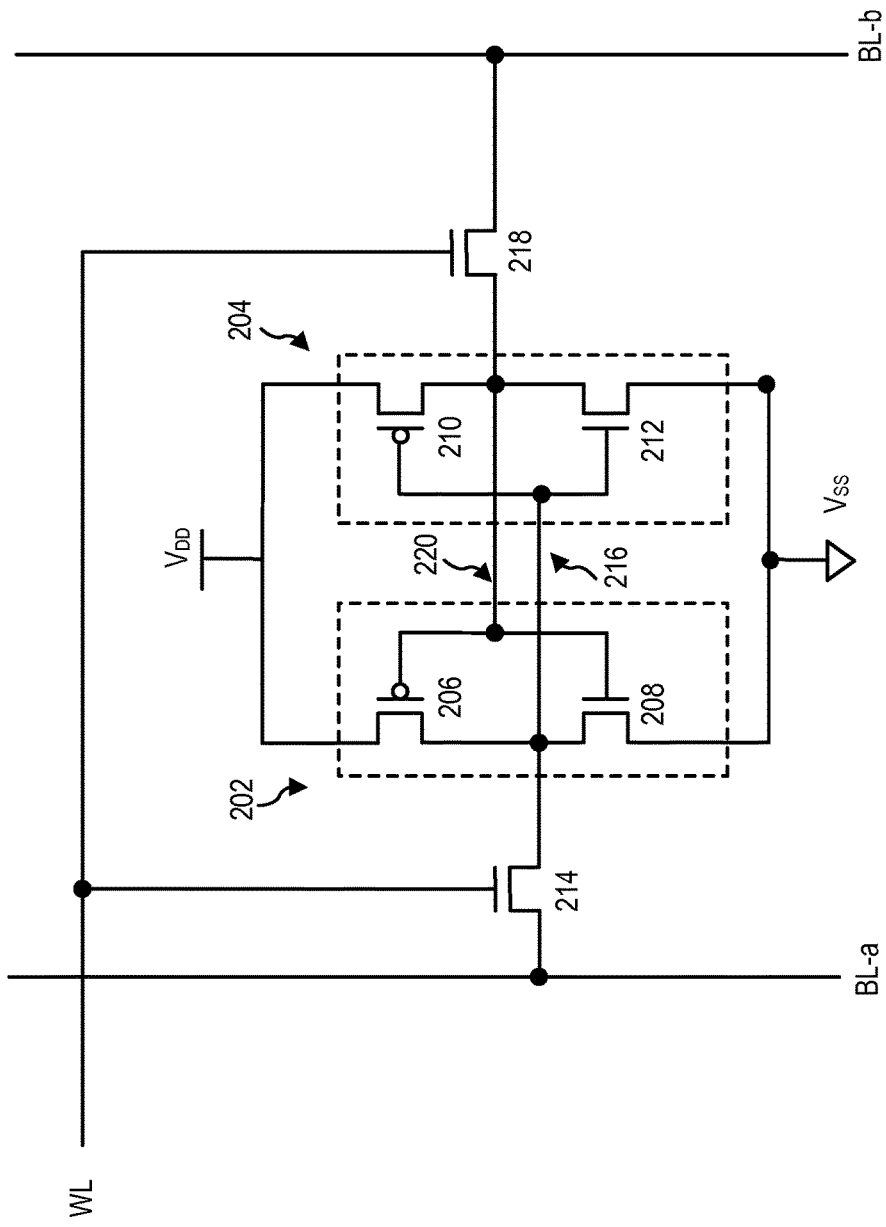
FIG. 2 is a schematic representation of an exemplary embodiment of a memory cell for an SRAM.

Each memory cell 114 is configured to store one bit of data (e.g., a logic 1 or a logic 0). FIG. 2 is a schematic diagram of an exemplary embodiment of a memory cell 200 for an SRAM. The memory cell 200 is implemented with a six-transistor (6T) configuration. However, as those skilled in the art will readily appreciate, the cell 200 may be implemented with a four-transistor (4T) or any other suitable transistor configuration.

The memory cell 200 is shown with two inverters 202, 204. The first inverter 202 comprises a p-channel transistor 206 and an n-channel transistor 208. The second inverter 204 comprises a p-channel transistor 210 and an n-channel transistor 212. In the described embodiment, the inverters 202 and 204 are powered by $V_{DD}$ and have a return $V_{SS}$ (e.g., ground). The first and second inverters 202, 204 are interconnected to form a cross-coupled latch. A first n-channel access transistor 214 couples the output node 216 from the second inverter 204 to a bitline BL-a, and a second n-channel access transistor 218 couples the output node 220 from the first inverter 202 to a bitline BL-b (the value of which is the opposite or inverse of the bitline BL-a). The gates of the access transistors 214, 218 are coupled to a wordline WL.

A write operation may be initiated by setting the bitlines BL-a and BL-b to the value to be written to the memory cell 200 and asserting the wordline WL. The wordline WL may be asserted before the value to be written (e.g., write data) is provided to the bitlines BL-a and BL-b. By way of example, a logic 1 may be written to the memory cell 200 by setting the bitline BL-a to a logic level 0 and the bitline BL-b to a logic 1. The logic level 0 at the bitline BL-a is applied to the input of the second inverter 204 through the access transistor 214, which in turn forces the output node 220 of the second inverter 204 to $V_{DD}$. The output node 220 of the second inverter 204 is applied to the input of the first inverter 202, which in turn forces the output node 216 of the first inverter 202 to $V_{SS}$. A logic level 0 may be written to the memory cell 200 by inverting the values of the bitlines BL-a and BL-b. The write driver 110 is designed to be stronger than pull-up transistors (206 and 210) in the memory cell 200 so that it can override the previous state of the cross-coupled inverters 202, 204.

Once the write operation is complete, the wordline is deasserted, thereby causing the access transistors 214 and 218 to disconnect the bitlines BL-a and BL-b from the two inverters 202, 204. The cross-coupling between the two inverters 202, 204 maintains the state of the inverter outputs as long as power is applied to the memory cell 200.

The memory cell 200 stores data according to the data values stored at nodes 216 and 220. If the memory cell 200 stores a logic high (i.e., a '1'), then node 216 is at a logic high and node 220 is at a logic low (i.e., a '0'). If the memory cell 200 stores a logic low, then node 216 is at a logic low and node 220 is at logic high. During a read operation, differential bit lines BL-1$a$ and BL-1$b$ are precharged by the pre-charge circuit. The word line WL is then asserted, thereby turning on n-channel transistors 214, 218.

If memory cell 200 stores a logic high, then bit line BL-1$a$ remains charged via n-channel transistor 214, and complimentary bit line BL-1$b$ is discharged via n-channel transistor 218. If memory cell 200 stores a logic low, then bit line BL-1$a$ is discharged via n-channel transistor 214, and complimentary bit line BL-1$b$ remains charged via re-channel transistor 218.

Figure 3:
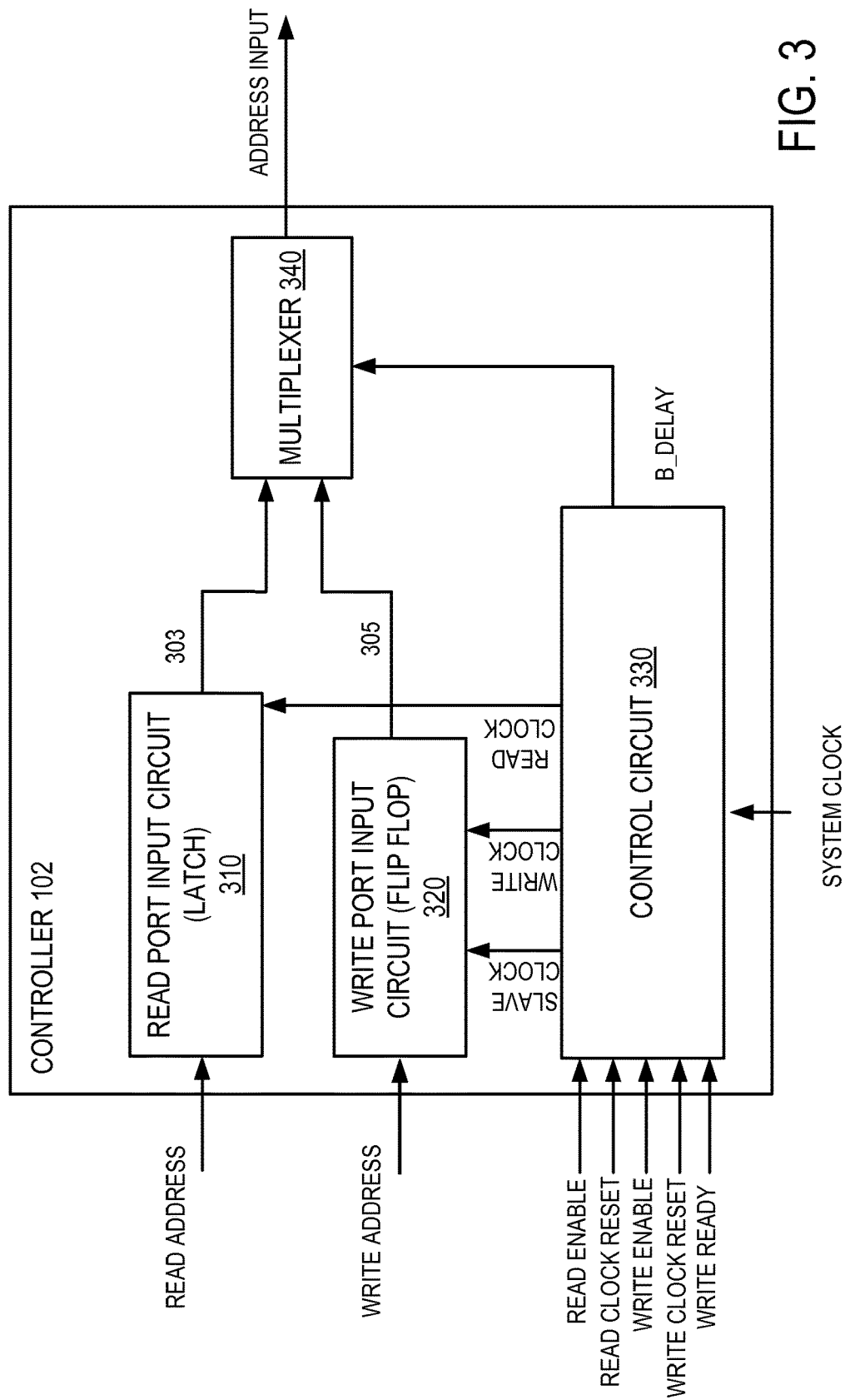
FIG. 3 is a functional block diagram illustrating an exemplary embodiment of a controller.

FIG. 3 is a functional block diagram illustrating an exemplary embodiment of a controller. The controller 102 includes a read port input circuit 310, a write port input circuit 320, a control circuit 330 and a multiplexer 340. The read port input circuit 310, the write port input circuit 320, and the multiplexer 340 function together to multiplex the READ and WRITE ADDRESSES from a peripheral device to the row and column decoders (see FIG. 1) under control of the control circuit 330.

The read port input circuit 310 is configured as a latch. In this configuration, the read port input circuit 310 receives the READ ADDRESS from a peripheral device (not shown), which is output as the internal READ ADDRESS 303 when the read port input circuit 310 is enabled by the READ CLOCK. The internal READ ADDRESS 303 is provided to one input of the multiplexer 340.

The write port input circuit 320 is configured as a flip flop. In this configuration, the write port input circuit 320 receives the WRITE ADDRESS from a peripheral device (not shown), which is output as the internal WRITE ADDRESS 305 when enabled by the SLAVE CLOCK and the WRITE CLOCK. The internal WRITE ADDRESS is provided to the other input of the multiplexer 340.

The control circuit 330 enables PDP memory operation which provides a read operation followed by a write operation in the same memory cycle. The memory cycle is defined by a SYSTEM CLOCK input to the controller 102. The control circuit 330 enables PDP memory operation by providing the READ, WRITE, and SLAVE CLOCKS used by the read and write port input circuits 310 and 320 to generate the internal READ and WRITE ADDRESSES 303 and 305, and by controlling the multiplexing of the internal READ and WRITE ADDRESSES to the row and column decoders 104 and 106 (see FIG. 1). The multiplexing is controlled by a select bit provide by the control circuit 330 to the multiplexer 340. The select bit is referred to herein as "B_DELAY."

In the described exemplary embodiment, the control circuit 330 is configured to support two modes. In the first mode, the control circuit 330 supports a read operation followed by a write operation in the same memory cycle. In the second mode, the control circuit 330 supports a write only operation in the memory cycle.

In the first mode, the READ CLOCK is set by the READ ENABLE. With the READ CLOCK set, the READ ADDRESS is provided to the input of multiplexer 340 through the read port input circuit 310. The B_DELAY signal from the control circuit 330 causes the multiplexer 340 to output the READ ADDRESS as the ADDRESS INPUT to the row and column decoders 104 and 106 (not shown) to perform a read operation. Once the read operation is complete, the READ CLOCK RESET is used by the control circuit 330 to reset the READ CLOCK.

The WRITE CLOCK is set by the WRITE ENABLE once the read operation is complete. With the WRITE CLOCK set, the WRITE ADDRESS is provided to the input of multiplexer 340 through the write port input circuit 320. The B_DELAY signal from the control circuit 330 causes the multiplexer 340 to output the WRITE ADDRESS as the ADDRESS INPUT to the row and column decoders 104 and 106 (see FIG. 1) to perform a write operation. Once the write operation is complete, the WRITE CLOCK RESET is used by the control circuit 330 to reset the WRITE CLOCK.

In the second mode, the READ ENABLE is not sent from the peripheral device. As a result, the READ CLOCK is not activated and a read operation is not performed. With the READ CLOCK inactive, the WRITE CLOCK is set by the WRITE ENABLE at the beginning of the memory cycle with the transition of the SYSTEM CLOCK. Similar to the first mode, once the WRITE CLOCK is set, the WRITE ADDRESS is provided to the input of multiplexer 340 through the write port input circuit 320. The B_DELAY signal from the control circuit 330 causes the multiplexer 340 to output the WRITE ADDRESS as the ADDRESS INPUT to the row and column decoders 104 and 106 (see FIG. 1) to perform a write operation. Once the write operation is complete, the WRITE CLOCK RESET is used by the control circuit 330 to reset the WRITE CLOCK.

Figure 4:
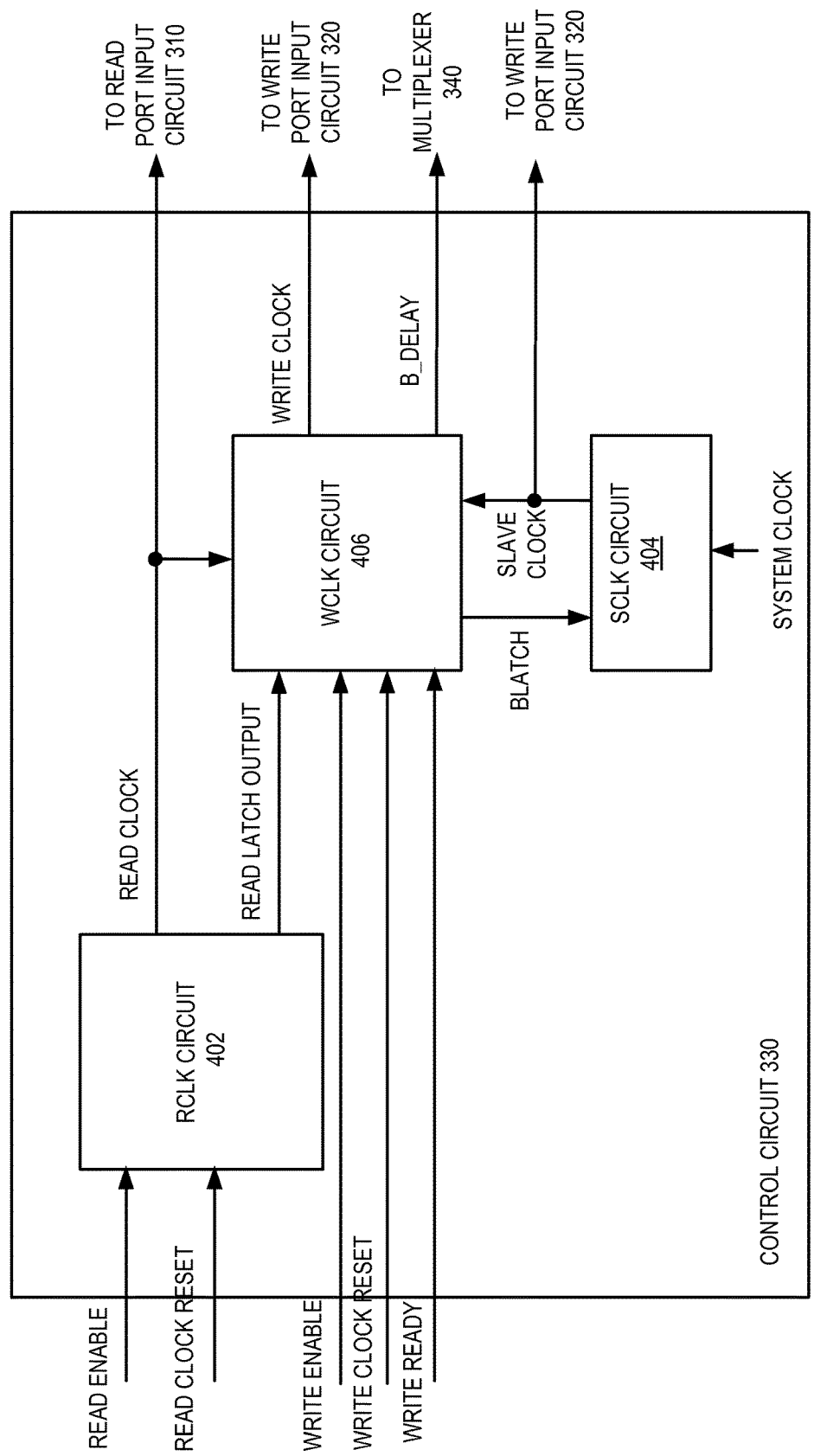
FIG. 4 is a functional block diagram illustrating an exemplary embodiment of a control circuit.

FIG. 4 is a functional block diagram illustrating an exemplary embodiment of a control circuit 330. The control circuit 330 includes an RCLK circuit 402 to generate the READ CLOCK, a WCLK circuit 406 to generate the WRITE CLOCK, and an SCLK circuit 404 to generate the SLAVE CLOCK.

The RCLK circuit 402 operates as a latch with an output that is set and reset by its inputs. In the described exemplary embodiment, the output from the RCLK circuit 402 is the READ CLOCK. The READ CLOCK is set by the READ ENABLE with the transition of the SYSTEM CLOCK and reset by the READ CLOCK RESET at the completion of the read operation. The READ CLOCK is provided to the read port input circuit 310 (see FIG. 3) as discussed earlier and the WCLK circuit 406. The READ LATCH OUTPUT, which is an inverted READ CLOCK, is provided to the WCLK circuit 406.

The WCLK circuit 406 operates as a flip-flop with an output that is set and reset by its inputs when enabled. In the described exemplary embodiment, the output from the WCLK circuit 406 is the WRITE CLOCK. The WCLK circuit 406 is enabled by an inactive READ CLOCK. With the READ CLOCK inactive, the WRITE CLOCK is set by the WRITE ENABLE and reset by the WRITE CLOCK RESET. Thus, even with the WRITE ENABLE set by a peripheral device prior to the transition of the SYSTEM CLOCK, the WCLK circuit 406 delays the setting of the WRITE CLOCK until the read operation is complete (i.e., the READ CLOCK is reset). When the memory is operating in a write only mode, the READ CLOCK remains inactive, and therefore, the WRITE CLOCK is set by the WRITE ENABLE which occurs at the beginning of the memory cycle (i.e., the transition of the SYSTEM CLOCK). In a manner to be described in greater detail later, the READ LATCH OUTPUT from the RCLK circuit 402 is used for the write only mode. The WCLK circuit 406 also generates the B_DELAY signal which is active during the write operation. The B_DELAY signal controls the operation of the address multiplexer 340 (see FIG. 3).

The SCLK circuit 404 generates the SLAVE CLOCK. The SLAVE CLOCK is used to enable the WCLK circuit 406. The SLAVE CLOCK is also output to the write port input circuit 320 (see FIG. 3). The SLAVE CLOCK may be used to satisfy internal timing constraints. The BLATCH signal is used to generate the SLAVE CLOCK, which follows the BLATCH signal with some predetermined delay to ensure internal timing constraints are met.

Figure 5:
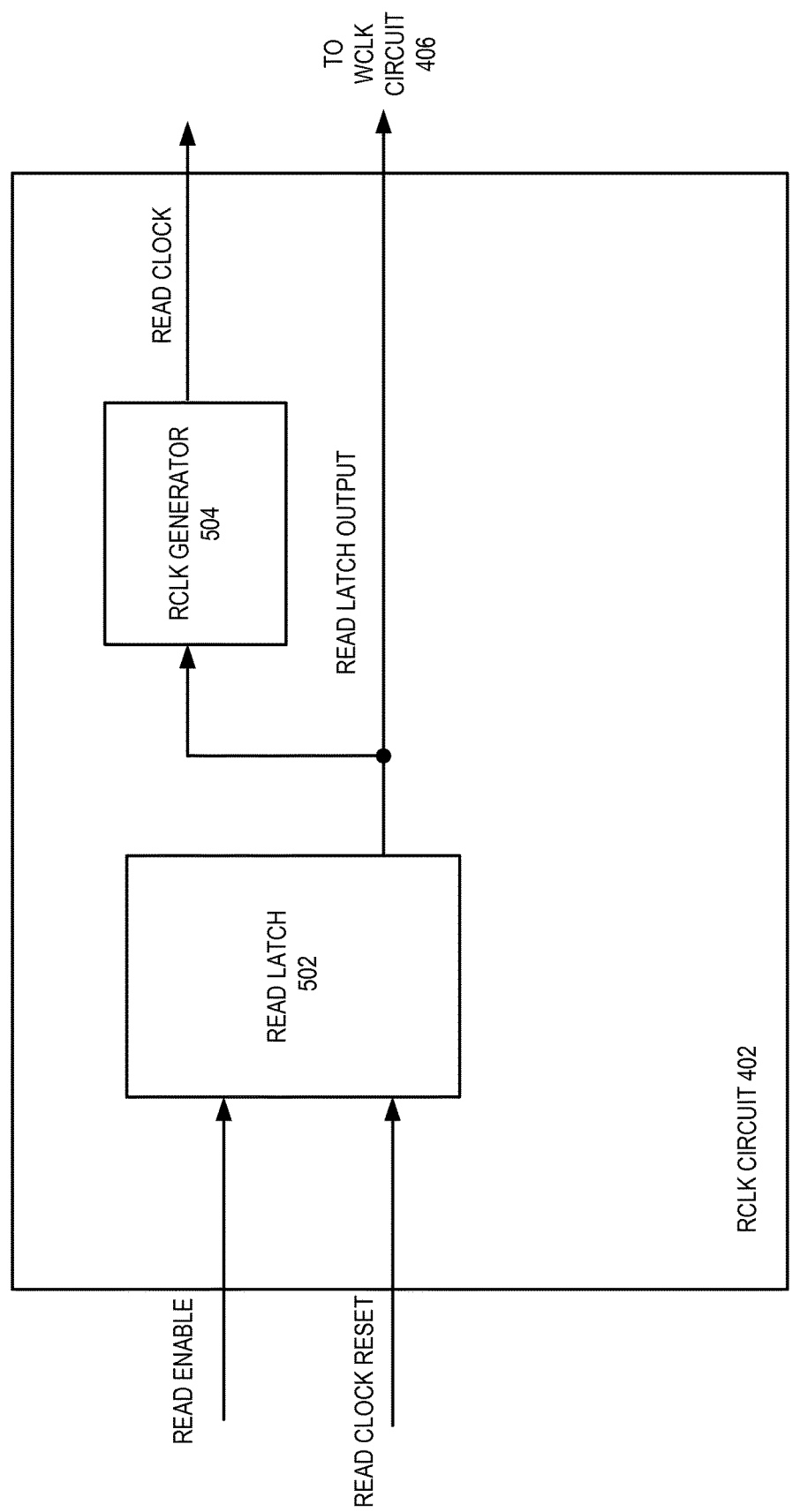
FIG. 5 is a functional block diagram illustrating an exemplary embodiment of an RCLK circuit.

FIG. 5 is a functional block diagram illustrating an exemplary embodiment of the RCLK circuit. The RCLK circuit 402 includes a read latch 502 and an RCLK generator 504.

The read latch 502 provides the latching function. The output from the read latch 502, the READ LATCH OUTPUT, is set to a low logic level by the READ ENABLE with the transition of the SYSTEM CLOCK and reset to a high logic level by the READ CLOCK RESET at the completion of the read operation. The READ LATCH OUTPUT is output from the RCLK circuit 402 to the WCLK circuit 406. The READ CLOCK is generated from the READ LATCH OUTPUT by the RCLK generator 504. The RCLK generator 504 is used to invert the READ LATCH OUTPUT to provide a READ CLOCK output with sufficient drive.

Figure 6:
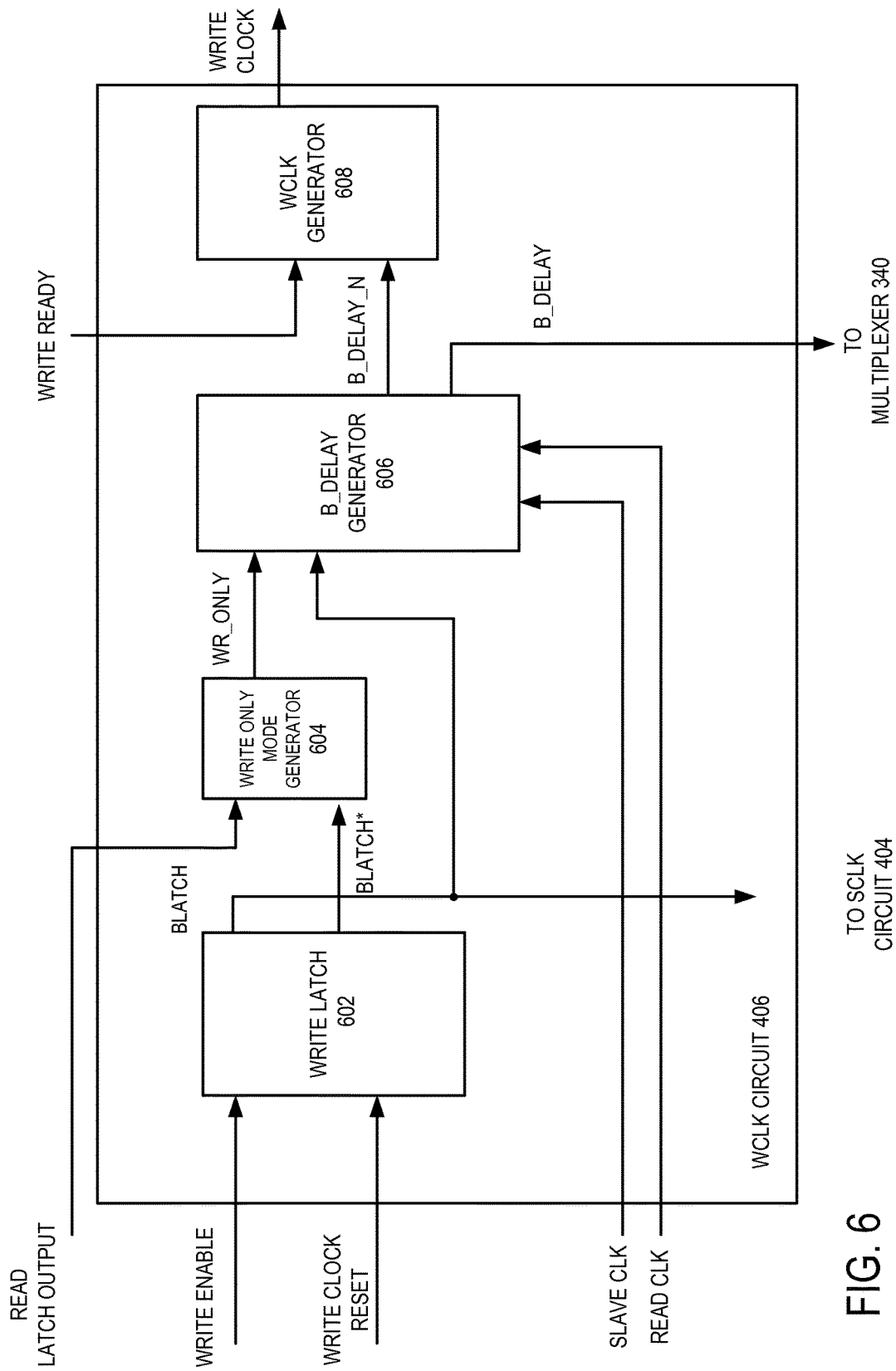
FIG. 6 is a functional block diagram illustrating an exemplary embodiment of a WCLK circuit.

FIG. 6 is a functional block diagram illustrating an exemplary embodiment of the WCLK circuit. The WCLK circuit 406 includes a write latch 602, a write only mode generator 604, a B_DELAY generator 606 and a WCLK generator 608.

The write latch 602 provides a latching function. The output from the write latch 602, referred herein to as BLATCH*, is set by the WRITE ENABLE with the transition of the SYSTEM CLOCK and reset by the WRITE CLOCK RESET at the completion of the write operation. As described earlier, the BLATCH signal is provided to the SCLK circuit 404.

The write only mode generator 604 is used to generate a WR_ONLY signal to indicate that the memory is operating in a write only mode. The write only mode generator 604 may be implemented as a logic circuit that provides a WR_ONLY signal indicating that the memory is operating in a write only mode in the absence of a READ CLOCK once the write latch is set at the beginning of the memory cycle. The mode generator determines whether the READ CLOCK is absent by monitoring the READ LATCH OUTPUT from the RCLK circuit 402 once the BLATCH signal from the write latch 602 is set. The write only mode generator 604 determines that the BLATCH signal is set from BLATCH* output from the write latch 602, which is the inverted BLATCH signal.

The B_DELAY generator 606 may also be implemented as a logic circuit that generates the B_DELAY signal for controlling the address multiplexer 340 (see FIG. 3). The B_DELAY generator 606 also generates B_DELAY_N, which is the inverted B_DELAY signal. The B_DELAY_N is used by the WCLK generator 608 to generate the WRITE CLOCK. The B_DELAY generator 606 used the BLATCH signal and the SLAVE CLOCK to determine the memory access period following the transition of the SYSTEM CLOCK. During the memory access period, the outputs from the B_DELAY generator track the BLATCH input signal when the WR_ONLY signal indicates that the memory is in the write only mode. When the memory is requested to perform a read and write operation in the same memory cycle by a peripheral device, the outputs from the B_DELAY generator 606 are forced into the inactive state despite the BLATCH signal being set by an active READ CLOCK. In this mode, once the read operation is complete, the outputs from the B_DELAY generator 606 are driven into the active state. In the active state, the address multiplexer 340 (see FIG. 3) is switched to multiplex the WRITE ADDRESS to the row and column decoders 104 and 106 (see FIG. 1) by the B_DELAY signal and the WCLK generator 608 is triggered by the B_DELAY_N signal in preparation for a write operation.

The WCLK generator 608 may also be implemented as a logic circuit. The WCLK generator 608 is used to generate the WRITE CLOCK from the B_DELAY_N signal from the B_DELAY generator 606 when the WRITE READY signal indicates that the memory is ready to perform a write operation.

FIG. 7A illustrates an exemplary timing diagram of the write only operation during a memory cycle.

The leading edge of the SYSTEM CLOCK marks the end of a previous memory cycle and the beginning of a new memory cycle. A peripheral device sets the state of the READ ENABLE and WRITE ENABLE prior to the leading edge of the SYSTEM CLOCK. In the timing diagram of FIG. 7A, the READ ENABLE is not asserted. Only the WRITE ENABLE is asserted meaning the memory is operating in a write only mode for that clock cycle.

With the WRITE ENABLE active, the BLATCH signal is set following the leading edge of the SYSTEM CLOCK. The BLATCH signal is used to generate the SLAVE CLOCK, which follows the BLATCH signal with some predetermined delay to ensure internal timing constraints are met.

In the write only mode, the WR_ONLY signal is asserted following the leading edge of the SYSTEM CLOCK. There is no read operation during this mode, so the READ CLOCK remains inactive during the entire memory cycle.

In the absence of a READ CLOCK, the B_DELAY_N signal occurs following the leading edge of the SYSTEM CLOCK. As explained earlier, the B_DELAY_N signal is forced into the active mode when the BLATCH signal is active and the READ CLOCK is inactive. Once the B_DELAY_N signal is active, the WRITE CLOCK is generated once the memory is ready for a write operation. In this mode, the WRITE READY signal is set during the entire memory cycle, so the WRITE CLOCK is set with the transitioning of the B_DELAY_N signal. The B_DELAY signal, which is an inverted B_DELAY_N signal, is provided to the address multiplexer 340 (see FIG. 3).

The BLATCH signal is forced into an inactive state when the write operation is complete. The resetting of BLATCH signal resets the SLAVE CLOCK, the WR_ONLY signal, B_DELAY and B_DELAY_N signals, and WRITE CLOCK.

FIG. 7B illustrates an exemplary timing of a read and write operation occurring during a memory cycle.

The leading edge of the SYSTEM CLOCK marks the end of a previous memory cycle and the beginning of a new memory cycle. A peripheral device sets the state of the READ ENABLE and WRITE ENABLE prior to the leading edge of the SYSTEM CLOCK. In the timing diagram of FIG. 7B, both the READ ENABLE and WRITE ENABLE are asserted.

The BLATCH signal is set following the leading edge of the SYSTEM CLOCK. The BLATCH signal is used to generate the SLAVE CLOCK, which follows the BLATCH signal with some predetermined delay to ensure internal timing constraints are met.

In this mode, the WR_ONLY signal is inactive, which signals both a read and write operation in the same memory cycle. With the WR_ONLY signal inactivated, the READ CLOCK is set following the leading edge of the SYSTEM CLOCK. The READ CLOCK is reset when the read operation is complete.

The resetting of the READ CLOCK forces the B_DELAY and B_DELAY_N into the active state. As explained earlier, the B_DELAY_N signal is forced into the active mode when the BLATCH signal is active and the READ CLOCK is inactive. Once the B_DELAY_N signal is active, the WRITE CLOCK is generated once the memory is ready for a write operation. In this mode, the WRITE READY signal is set during the entire memory cycle, so the WRITE CLOCK is set with the transitioning of the B_DELAY_N signal. The B_DELAY signal, which is an inverted B_DELAY_N signal, is provided to the address multiplexer 340 (see FIG. 3).

The BLATCH signal is forced into an inactive state when the write operation is complete. The resetting of BLATCH signal resets the SLAVE CLOCK, the WR_ONLY signal, B_DELAY and B-DELAY_N signals, and WRITE CLOCK.

Figure 8:
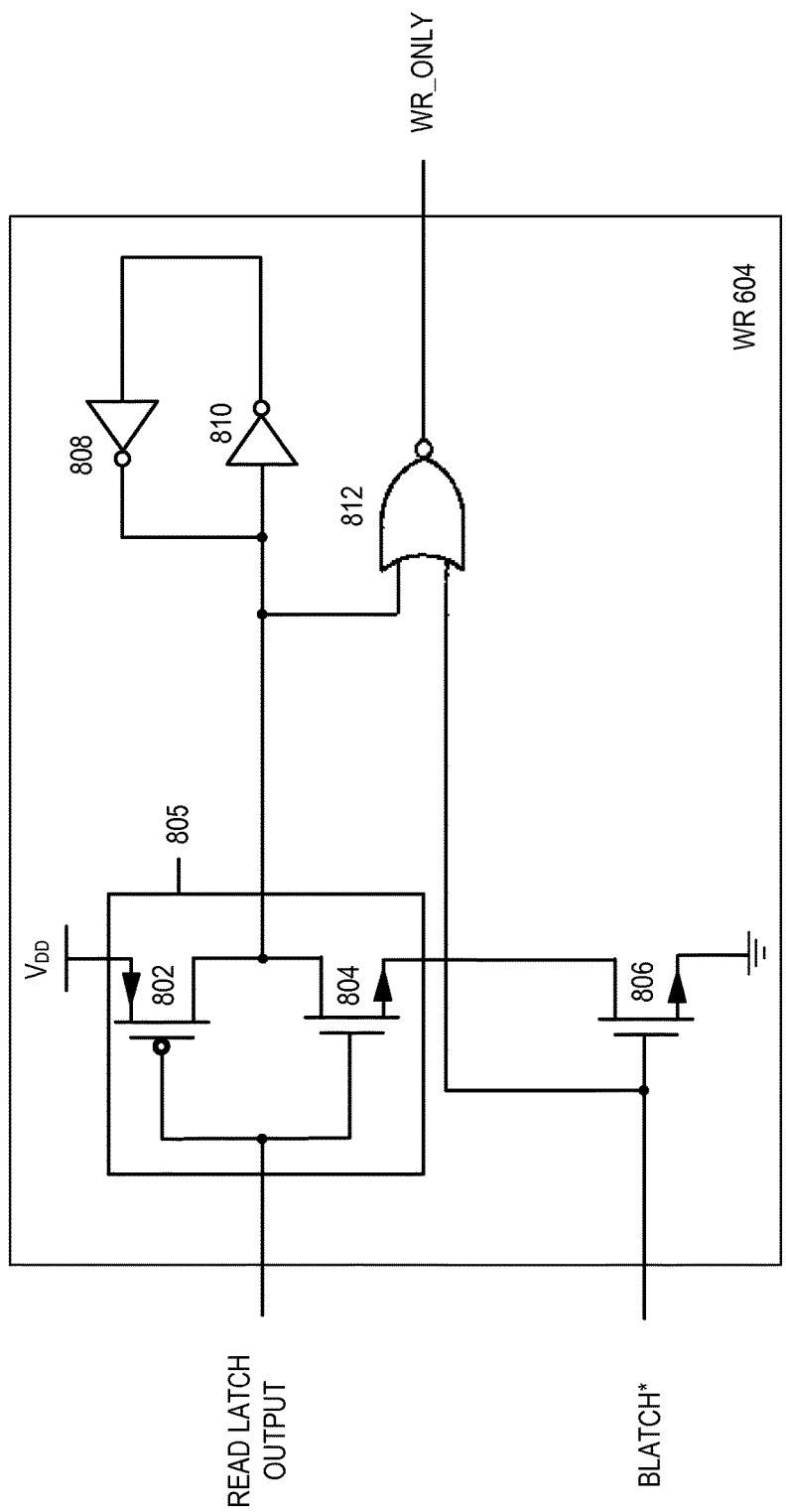
FIG. 8 is a schematic diagram of an exemplary embodiment of a write only mode generator.

FIG. 8 is a schematic diagram of an exemplary embodiment of a write only mode generator. The write only mode generator 604 includes a p-channel transistor 802, n-channel transistors 804 and 806, inverters 808 and 810, and a NOR gate 812.

The transistors 802 and 804 are configured as an inverter 805 with the source of the p-channel transistor 802 coupled to $V_{DD}$ and the source of the n-channel transistor 804 coupled to GND through the n-channel transistor 806. The inverter 805 has a common input coupled to the gates of the p-channel and n-channel transistors 802 and 804. In the described exemplary embodiment, the READ LATCH OUTPUT from the RCLK circuit 402 (see FIG. 4) is provided to the common input. The drains of the transistors 802 and 804 are coupled together to provide the output of the inverter 805.

The n-channel transistor 806, which provides a ground path for output of the inverter 805, includes a drain coupled to the source of the n-channel transistor 804 and a source coupled to GND. The transistor 806 has a gate that provides an input. In the described exemplary embodiment, the BLATCH* signal from the write latch 602 (see FIG. 6) is input to the gate of the transistor 806.

The NOR gate 812 generates the WR_ONLY signal output by gating the output from the inverter 805 with the BLATCH* signal. The inverters 808 and 810 form a cross-coupled latch to keep the output of the inverter 805 from floating under certain operating conditions.

The NOR gate 812 operates as an inverter with an enable input. In this configuration, the NOR gates 812 inverts the output from the inverter 805 when the BLATCH* signal is in a low logic state. As a result, the WR_ONLY signal follows the READ LATCH OUTPUT signal when the BLATCH* signal is in a low logic state. When the BLATCH* signal is in a high logic state, the WR_ONLY signal (i.e., the output of the NOR gate 812) is forced into a low logic state regardless of the state of the READ LATCH OUTPUT signal.

In the write only mode, the BLATCH* signal is initially in a high logic state, which forces the n-channel transistor 806 into an on state. The READ LATCH OUTPUT signal is also in a high logic state, which forces the p-channel transistor 802 into an off state and the n-channel transistor 804 into an on state. As a result, the input to the NOR gate 812 output from the inverter 805 is pulled down to GND through transistors 804 and 806.

With the transition of the SYSTEM CLOCK, the BLATCH* signal is driven into a low logic state, thereby forcing the n-channel transistor 806 into an off state. With the n-channel transistor 806 is an off state, the output from the inverter 805 is disconnected from GND. The READ CLOCK is inactive in this mode, resulting in a READ LATCH OUTPUT signal that remains in a high logic state following the transition of the SYSTEM CLOCK. As a result, the p-channel transistor 802 remains in an off state and the n-channel transistor 804 remains in an on state. The cross-coupled inverters 808 and 810 maintain the output from the inverter 805 in a low logic state during this period. The WR_ONLY signal is forced into a high logic state by the low logic state of the inverter 805 and the write operation is performed.

The BLATCH* signal is driven into a high logic state following the completion of the write operation, which forces the n-channel transistor 806 into an on state. In this state, the n-channel transistor 806 provides a ground path to the output from the inverter 805. The BLATCH* signal provided to the input of the NOR gate 812 also forces the WR_ONLY signal into a low logic state for the remainder of the memory cycle.

In the read and write mode, the BLATCH* signal is initially in a high logic state, which forces the n-channel transistor 806 into an on state. The READ LATCH OUTPUT is also in a high logic state, which forces the p-channel transistor 802 into an off state and the n-channel transistor 804 into an on state. As a result, the input to the NOR gate 812 output from the inverter 805 is pulled down to GND through transistors 804 and 806.

With the transition of the SYSTEM CLOCK, the BLATCH* signal is driven into a low logic state, thereby forcing the n-channel transistor 806 into an off state. With the n-channel transistor 806 is an off state, the output from the inverter 805 is disconnected from GND. The READ CLOCK is set following the transition of the SYSTEM CLOCK, resulting in a READ LATCH OUTPUT signal that is driven into a low logic state. As a result, the p-channel transistor 802 is forced into an on state and the n-channel transistor 804 is forced into an off state. The output from the inverter is pulled up to $V_{DD}$ (i.e., a high logic state) through the p-channel transistor 802. With the BLATCH* signal is a low logic state, the WR_ONLY signal output from the NOR gate 812 remains in a low logic state while the read operation is performed.

The READ LATCH OUTPUT signal is driven into a high logic state following the completion of the read operation, thereby forcing the p-channel transistor 802 into an off state and the n-channel transistor 804 into an on state. The cross-coupled inverters 808 and 810 maintain the output from the inverter 805 in a high logic state during this period. With the output from the inverter 805 in a high logic state, the WR_ONLY signal remains in a low logic state while the write operation is performed.

The BLATCH* signal is driven into a high logic state following the completion of the write operation, which forces the n-channel transistor 806 into an on state. In this state, the n-channel transistor 806 provides a ground path to the output from the inverter 805. The BLATCH* signal provided to the input of the NOR gate 812 also keeps the WR_ONLY signal into a low logic state for the remainder of the memory cycle.

Figure 9:
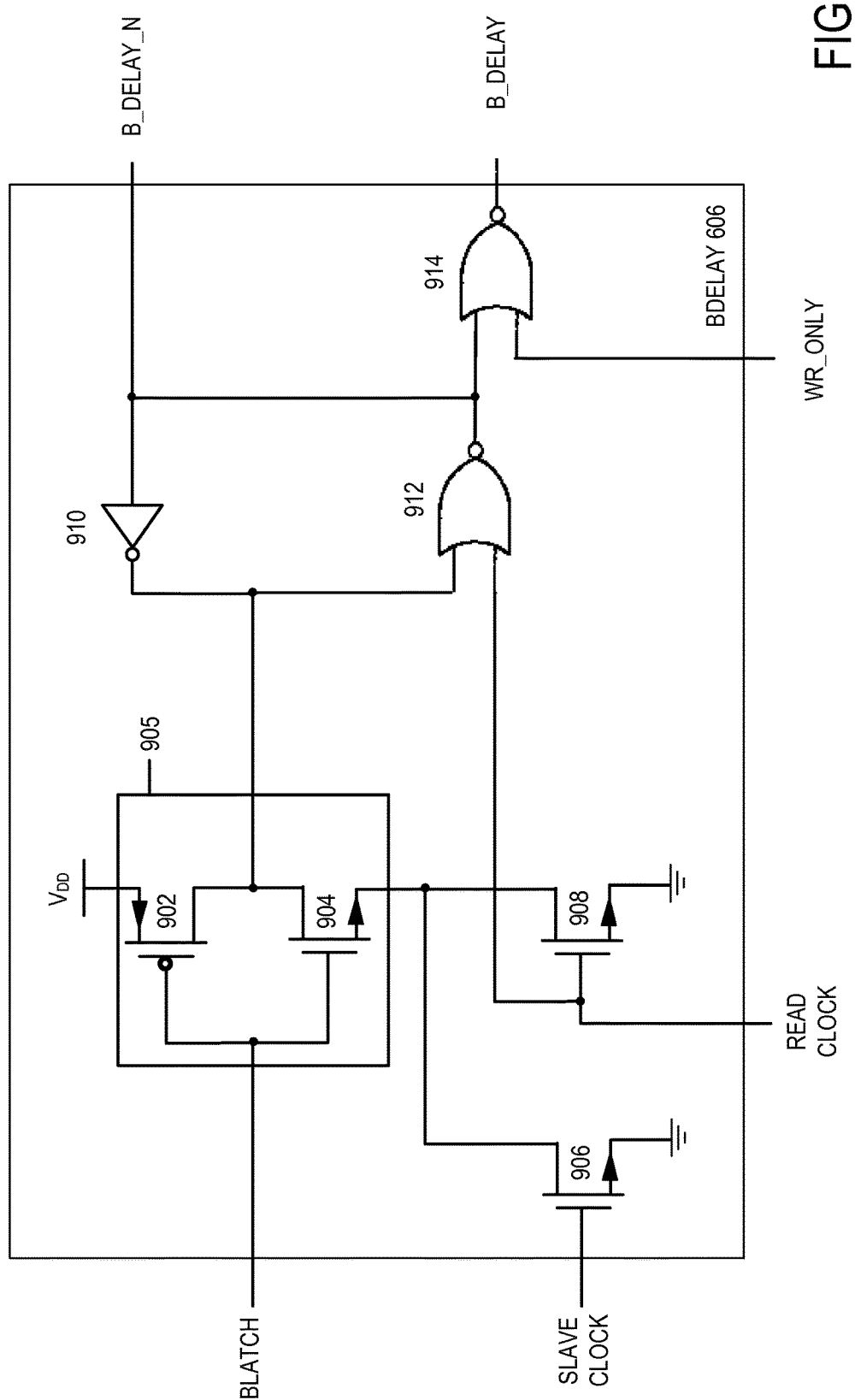
FIG. 9 is a schematic diagram of an exemplary embodiment of a BDELAY generator.

FIG. 9 is a schematic diagram of an exemplary embodiment of a BDELAY generator. The BDELAY generator 606 includes a p-channel transistor 902, n-channel transistors 904, 906 and 908, an inverter 910, and NOR gates 912 and 914.

The transistors 902 and 904 are configured as an inverter 905 with the source of the p-channel transistor 902 coupled to $V_{DD}$ and the source of the n-channel transistor 904 coupled to GND through the n-channel transistors 906 and 908. The inverter 905 has a common input coupled to the gates of the p-channel and n-channel transistors 902 and 904. In the described exemplary embodiment, the BLATCH signal from the write latch 602 (see FIG. 6) is provided to the common input. The drains of the transistors 902 and 904 are coupled together to provide the output of the inverter 905.

The n-channel transistor 906, which provides one ground path for output of the inverter 905, includes a drain coupled to the source of the n-channel transistor 904 and a source coupled to GND. The transistor 906 has a gate that provides an input. In the described exemplary embodiment, the SLAVE CLOCK from the SCLK circuit 404 (see FIG. 4) is input to the gate of the transistor 906.

The n-channel transistor 908, which provides the other ground path for output of the inverter 905, includes a drain coupled to the source of the n-channel transistor 904 and a source coupled to GND. The transistor 908 has a gate that provides an input. In the described exemplary embodiment, the READ CLOCK from the RCLK circuit 402 (see FIG. 4) is input to the gate of the transistor 908.

The NOR gate 912 generates an output by gating the output from the inverter 905 with the READ CLOCK. The inverter 910 is used to keep the output of the inverter 905 from floating under certain operation conditions.

The NOR gate 912 operates as an inverter with an enable input. In this configuration, the NOR gate 912 inverts the output from the inverter 905 when the READ CLOCK is in a low logic state. As a result, the output from the NOR gate 912 follows the BLATCH signal when the READ CLOCK is in a low logic state. When the READ CLOCK is in a high logic state, the output from the NOR gate 912 is forced into a low logic state regardless of the state of the BLATCH signal. The output from the NOR gate 912 is the B_DELAY_N signal.

The NOR gate 914 also operates as an inverter with an enable input. In this configuration, the NOR gate 914 inverts the B_DELAY_N signal when the WR_ONLY signal from the write only mode generator 604 (see FIG. 6) is in a low logic state. As a result, the output from the NOR gate 914 provides an inverted BLATCH signal as the B_DELAY signal when both the READ CLOCK and the WR_ONLY signal are in low logic states. When the WR_ONLY signal is in a high logic state, the B_DELAY signal is forced into a low logic state regardless of the state of the B_DELAY_N signal. When the WR_ONLY signal is in a low logic state and the READ CLOCK is in a high logic state, the B_DELAY signal is forced into a high logic state regardless of the state of the BLATCH signal.

In the write only mode, the SLAVE and READ CLOCKS are initially in low logic states, which forces n-channel transistors 906 and 908 into their respective off states. The BLATCH signal is also in a low logic state, which forces the p-channel transistor 902 into an on state and the n-channel transistor 904 into an off state. As a result, the input to the NOR gate 912 output from the inverter 905 is pulled up to $V_{DD}$ through the transistor 902.

With the transition of the SYSTEM CLOCK, the BLATCH signal is driven into a high logic state, thereby forcing the p-channel transistor 902 into an off state and the n-channel transistor 904 into an on state. Shortly thereafter, the SLAVE CLOCK is driven into a high logic state, thereby forcing the n-channel transistor 906 into an on state. With the n-channel transistor 906 in an on state, the output from the inverter 905 is pulled down to GND through transistors 904 and 906. The READ CLOCK is inactive in this mode, and as a result, the n-channel transistor 908 remains in the off state. With the READ CLOCK is a low logic state, the BLATCH signal is passed to the output of the NOR gate 912, which means that the B_DELAY_N signal follows the BLATCH signal during the write operation. The WR_ONLY signal is also driven into a high logic state following the transition of the SYSTEM CLOCK, thereby forcing the B_DELAY signal into a low logic state during the write operation.

The BLATCH signal is driven into a low logic state following the completion of the write operation, which forces the p-channel transistor 902 into an on state and the re-channel transistor 904 into an off state. In this state, the p-channel transistor 902 pulls up the output of the inverter 905 to $V_{DD}$. Shortly thereafter, the SLAVE CLOCK is driven into a low logic state, thereby forcing the n-channel transistor 906 into an off state. With the READ CLOCK in a low logic state, the output from the NOR gate 912 (i.e., the B_DELAY_N signal) follows the BLATCH signal, which means the B_DELAY_N signal is forced into a low logic state for the remainder of the memory cycle. The WR_ONLY signal is forced into a low logic state following the completion of the write operation, and as a result, the B_DELAY signal is forced into a high logic state for the remainder of the memory cycle.

In the read and write mode, the SLAVE and READ CLOCKS are initially in low logic states, which forces n-channel transistors 906 and 908 into their respective off states. The BLATCH signal is also in a low logic state, which forces the p-channel transistor 902 into an on state and the n-channel transistor 904 into an off state. As a result, the input to the NOR gate 912 output from the inverter 905 is pulled up to $V_{DD}$ through the transistor 902.

With the transition of the SYSTEM CLOCK, the BLATCH signal is driven into a high logic state, thereby forcing the p-channel transistor 902 into an off state and the n-channel transistor 904 into an on state. Shortly thereafter, the READ AND SLAVE CLOCKS are driven into high logic states, thereby forcing the n-channel transistors 906 and 908 into on states. With the n-channel transistors 906 and 908 in on states, the output from the inverter 905 is pulled down to GND through one path comprising transistors 904 and 906 and another path comprising transistors 904 and 908. The READ CLOCK, however, forces the output of the NOR gate 912 (i.e., the B_DELAY_N signal) into low logic state. The low logic state of the B_DELAY_N signal forces the B_DELAY signal into a high state with the WR_ONLY in a low logic state. In other words, the B_DELAY_N and B_DELAY signals are forced into low and high logic states, respectively, thereby preventing these signals from following the BLATCH signal, and as a result, delaying the WRITE CLOCK until the completion of the read operation.

The BLATCH signal remains in a high logic state following the completion of the read operation. The READ CLOCK is driven into a low logic state, thereby forcing the n-channel transistor 908 into an off state. However, the output from the inverter 905 continues to be pulled down to GND through the n-channel transistor 906 because the SLAVE CLOCK remains in a high logic state. With READ CLOCK in a low logic state the B_DELAY_N follows the BLATCH signal. With the READ CLOCK and the WR_ONLY signal in low logic states, the B_DELAY signal is the inverted B_DELAY_N signal. More specifically, the B_DELAY_N signal is driven into a high logic state and the B_DELAY signal is driven into a low logic state for the entire write operation.

The BLATCH signal is forced into a low logic state following the completion of the write operation, which forces the p-channel transistor 902 into an on state and the re-channel transistor 904 into an off state. Shortly thereafter, the SLAVE CLOCK is forced into a low logic state, thereby forcing the n-channel transistor 906 into the off state. As a result, the output from the inverter is pulled up to $V_{DD}$ through the transistor 902. With READ CLOCK in a low logic state the B_DELAY_N follow the BLATCH signal and is driven into a low logic state. With the READ CLOCK and the WR_ONLY signal in low logic states, the B_DELAY signal is driven into a high logic state. The states of the B_DELAY_N and the B_DELAY signals remain at this state for the duration of the memory cycle.

Figure 10:
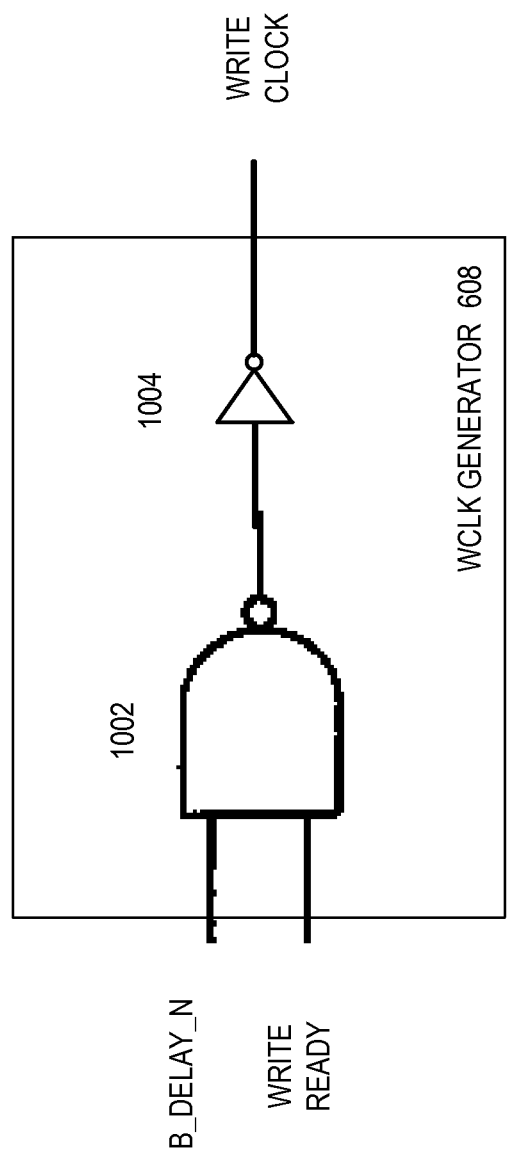
FIG. 10 is a schematic diagram of an exemplary embodiment of a WCLK generator.

FIG. 10 is a schematic diagram of an exemplary embodiment of a write clock generator. The write clock generator 608 includes a NAND gate 1002 and an inverter 1004.

The inputs of the NAND gate 1002 are coupled to WRITE READY and B_DELAY_N, respectively. The purpose of the NAND gate 1002 is to delay the WRITE CLOCK from being generated by the B_DELAY_N signal until the memory is ready for a write operation as indicated by the WRITE READY signal.

The NAND gate 1002 in combination with the inverter 1004 generates the WRITE CLOCK from the B_DELAY_N signal when the WRITE READY signal is present. When the WRITE READY signal is in a low logic state, either at the beginning of the memory cycle in the write only mode or following the completion of the read operation in the read/write mode, the WRITE CLOCK remains in a low logic state even though the B_DELAY_N signal is in a high logic state. When the memory is ready for a write operation, the WRITE READY signal is forced into a high logic state, which in turn forces the WRITE CLOCK into a high logic state. The WRITE CLOCK remains in a high logic state until the B_DELAY_N signal is forced into a low logic state at the completion of the write operation.

Figure 11:
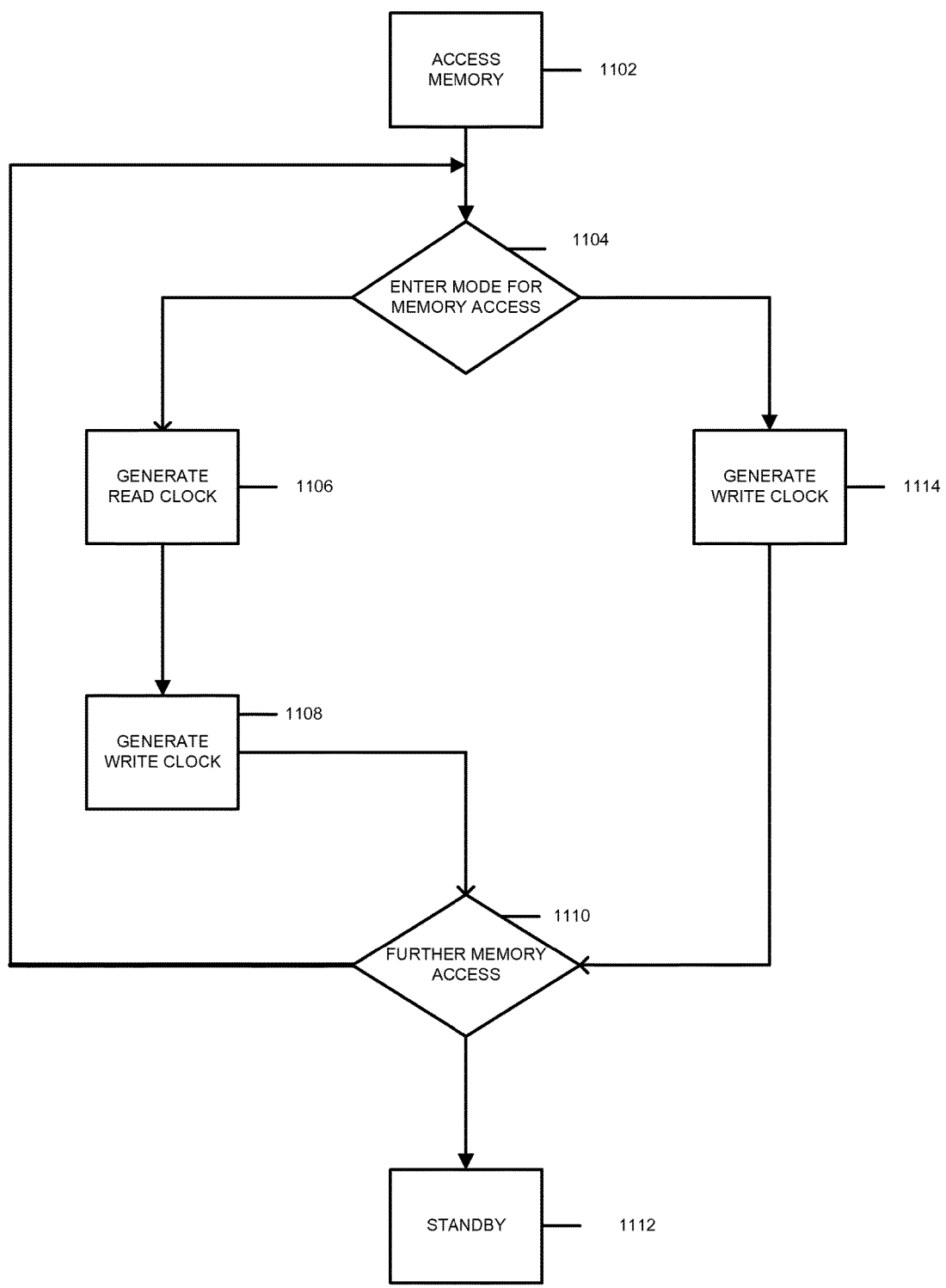
FIG. 11 is a flow diagram illustrating an exemplary embodiment of a method for accessing memory.

FIG. 11 is a flow diagram illustrating an exemplary embodiment of a method of accessing memory. The memory includes a plurality of memory cells configured to support a read and write operation in a memory cycle in a first mode and a write only operation in the memory cycle in a second mode.

The method is initiated with a memory access in block 1102. The memory access may be a command from a remote processor or other suitable signal or prompt that causes the memory to begin a memory access. The memory then enters a mode for the memory access in block 1104. As mentioned above, the memory enters into a first mode to perform a read and write operation in the upcoming memory cycle or a second mode to perform a write only operation in the upcoming memory cycle.

When the memory enters the first mode, a read clock is generated in block 1106 for the read operation. Following the read operation, a write clock is generated in block 1108 for the write operation. In one exemplary embodiment, the read clock is generated by setting the read clock in response to the beginning of the memory cycle and resetting the read clock when the read operation is complete. In the same exemplary embodiment, the write clock is generated by setting the write clock in response to the resetting of the read clock and resetting the write clock when the write operation is complete. After the write operation is complete, a determination is made as to whether another memory access is required in block 1100. If a further memory access is not required, the memory may enter into a standby mode in block 1112 until the next memory access. If, on the other hand, a further memory access is required, the method loops back to block 1104 to repeat the process.

When the memory enters the second mode, a write clock is generated in block 1114 for the write operation. In one exemplary embodiment, the write clock is generated by setting the write clock in response to in response to the beginning of the memory cycle and resetting the write clock when the write operation is complete. After the write operation is complete, a determination is made as to whether another memory access is required in block 1100. If a further memory access is not required, the memory may enter into a standby mode in block 1112 until the next memory access. If, on the other hand, a further memory access is required, the method loops back to block 1104 to repeat the process.

The previous description is provided to enable any person skilled in the art to fully understand the full scope of the disclosure. Modifications to the various exemplary embodiments disclosed herein will be readily apparent to those skilled in the art. Thus, the claims should not be limited to the various aspects of the disclosure described herein, but shall be accorded the full scope consistent with the language of claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A memory, comprising: a plurality of memory cells configured to support a read and write operation in a memory cycle in a first mode and a write only operation in the memory cycle in a second mode; and a control circuit configured to generate a read clock for the read operation and a write clock for the write operation, the read clock separate from the write clock, wherein the control circuit comprises: a read clock circuit configured to generate the read clock in response to the beginning of the memory cycle in the first mode and reset the read clock when the read operation is complete; and a write clock circuit comprising: a first circuit having an output configured to be set in response to the beginning of the memory cycle and reset when the write operation is complete; and a second circuit configured to generate the write clock when the first circuit output is set and the read clock is in a reset state in the first mode, and the beginning of the memory cycle in the second mode.

2. The memory of claim 1, wherein the control circuit is further configured to generate the write clock by setting the write clock in response to the resetting of the read clock in the first mode.

3. The memory of claim 1, wherein the control circuit is further configured to generate the write clock by setting the write clock in response to the beginning of the memory cycle in the second mode.

4. The memory of claim 1, wherein the write clock circuit is further configured to reset the write clock when the write operation is complete.

5. The memory of claim 1, wherein: the first circuit comprises a latch; and the second circuit comprises logic to gate the first circuit output and the read clock.

6. A method of accessing memory comprising a plurality of memory cells configured to support a read and write operation in a memory cycle in a first mode and a write only operation in the memory cycle in a second mode, the method comprising: generating, in the first mode, a read clock for the read operation and a write clock for the write operation, the read clock separate from the write clock, wherein the generating the write clock comprises: setting an output in response to the beginning of the memory cycle and resetting the output when the write operation is complete; and setting the write clock when the output is set and the read clock is in a reset state, in the first mode; and generating, in the second mode, the write clock for the write operation in response to the beginning of the memory cycle.

7. The method of claim 6, wherein:
the generating the read clock, in the first mode, comprises setting the read clock in response to the beginning of the memory cycle and resetting the read clock when the read operation is complete; and
the generating the write clock, in the first mode, comprises setting the write clock in response to the resetting of the read clock and resetting the write clock when the write operation is complete.

8. The method of claim 6, wherein the generating the write clock, in the second mode, comprises setting the write clock in response to the beginning of the memory cycle and resetting the write clock when the write operation is complete.

9. A memory comprising: a plurality of memory cells configured to support a read and write operation in a memory cycle in a first mode and a write only operation in the memory cycle in a second mode; and a control circuit configured to generate a read clock for the read operation and a write clock for the write operation, the read clock separate from the write clock, wherein the control circuit comprises: a read clock circuit configured to generate the read clock in response to the beginning of the memory cycle in the first mode and reset the read clock when the read operation is complete; and a write clock circuit configured to generate the write clock in response to: the resetting of the read clock in the first mode; and the beginning of the memory cycle in the second mode, wherein a timing of the write clock is a function of a timing of the read clock in the first mode, and wherein the write clock occurs earlier in the memory cycle in the second mode than in the first mode.

10. The memory of claim 9, wherein the control circuit is further configured to generate the write clock by setting the write clock in response to resetting the read clock in the first mode.

11. The memory of claim 9, wherein the control circuit is further configured to generate the write clock by setting the write clock in response to the beginning of the memory cycle in the second mode.

12. The memory of claim 9, wherein the write clock circuit is further configured to reset the write clock when the write operation is complete.

13. The memory of claim 9, wherein the control circuit comprises a write clock circuit comprising:

a first circuit having an output configured to be set in response to the beginning of the memory cycle and reset when the write operation is complete; and a second circuit configured to set the write clock when the first circuit output is set and the read clock is in a reset state.

14. The memory of claim 13, wherein:

the first circuit comprises a latch; and the second circuit comprises logic to gate the first circuit output and the read clock.

* * * * *